US012764892B2

(12) United States Patent
Chen

(10) Patent No.: US 12,764,892 B2
(45) Date of Patent: Oct. 13, 2026

(54) MULTIFUNCTIONAL BASE, CONNECTING STRUCTURE AND PORTABLE ELECTRONIC DEVICE

(71) Applicant: ZTARX CORPORATION LIMITED, Shenzhen (CN)

(72) Inventor: Song Ping Chen, Shenzhen (CN)

(73) Assignee: ZTARX CORPORATION LIMITED, Shenzhen (CN)

( * ) Notice: Subject to any disclaimer, the term of this patent is extended or adjusted under 35 U.S.C. 154(b) by 935 days.

(21) Appl. No.: 17/852,289

(22) Filed: Jun. 28, 2022

(65) Prior Publication Data

US 2023/0035082 A1 Feb. 2, 2023

(30) Foreign Application Priority Data

Aug. 2, 2021 (CN) ......................... 202121788325.2

(51) Int. Cl.
*H05K 7/18* (2006.01)
*H05K 7/02* (2006.01)

(52) U.S. Cl.
CPC ................. *H05K 7/18* (2013.01); *H05K 7/02* (2013.01)

(58) Field of Classification Search
CPC .......... H05K 7/18; H05K 7/02; H05K 5/0234; H04R 1/025; H04R 1/1025; H04R 1/028; H04R 1/023; H04R 2201/029; H04R 5/02; A63H 23/00
See application file for complete search history.

(56) References Cited

U.S. PATENT DOCUMENTS

| | | | | |
|---|---|---|---|---|
| 10,584,840 | B2 * | 3/2020 | Ashmore | F21V 29/70 |
| 10,704,746 | B2 * | 7/2020 | Jeong | F21V 3/026 |
| 10,724,695 | B2 * | 7/2020 | Tang | F21V 5/007 |
| 10,871,284 | B2 * | 12/2020 | Yan | F21V 23/0485 |
| 2012/0263331 | A1 * | 10/2012 | Newman | A01K 1/0353 381/333 |
| 2013/0187569 | A1 * | 7/2013 | Chin-Huan | F21V 23/0485 315/307 |
| 2018/0048949 | A1 * | 2/2018 | Chen | H04R 1/023 |
| 2020/0088360 | A1 * | 3/2020 | Salzinger | F21L 4/02 |
| 2020/0383444 | A1 * | 12/2020 | Chen | A45C 13/008 |
| 2022/0312979 | A1 * | 10/2022 | Nishibori | G10K 11/18 |
| 2022/0339962 | A1 * | 10/2022 | Winters | A63H 3/006 |

* cited by examiner

*Primary Examiner* — Ko H Chan
(74) *Attorney, Agent, or Firm* — HOWARD M COHN and Associates, LLC

(57) ABSTRACT

A multifunctional base includes a flexible member and a base connected to an end of the flexible member. The base includes a rigid shell, a connecting edge extends along a periphery of the rigid shell, the flexible member is connected to the base via the connecting edge, and the connecting edge is made of flexible material. A connecting structure and an electronic device are also provided.

7 Claims, 16 Drawing Sheets

MULTIFUNCTIONAL BASE, CONNECTING STRUCTURE AND PORTABLE ELECTRONIC DEVICE

CROSS-REFERENCE TO RELATED APPLICATIONS

The application claims priority of Chinese patent application CN202121788325.2, filed on Aug. 2, 2021, which is incorporated herein by reference in its entireties.

FIELD

The subject matter herein generally relates to electronic device, and particularly relates to a multifunctional base, a connecting structure and a portable electronic device.

BACKGROUND

In outdoor activities, various electronic devices are often used, such as power banks, fans, mosquito control lamps, makeup mirrors, floodlights, spray water replenishing devices, etc. These electronic devices facilitate people's lives, but carrying a large number of electronic devices is very inconvenient, which may cause trouble to travel. Existing technologies, which can power a number of electronic devices with different functions at the same time, are designed to occupy large space, which is not convenient to carry.

SUMMARY

In order to resolve above-mentioned deficiencies, the present disclosure provides a multifunctional base, a connecting structure and an electronic device which is convenient to carry and can supply power to electronic devices with different functions.

A multifunctional base includes a flexible member and a base connected to an end of the flexible member. The base includes a rigid shell and a connecting edge. The connecting edge extends along a periphery of the rigid shell, the flexible member is connected to the base via the connecting edge, and the connecting edge is made of flexible material.

A connecting structure includes a flexible member, a rigid shell, and a connecting edge. The flexible member is connected to the rigid shell via the connecting edge, and the connecting edge is made of flexible material.

An electronic device includes an electronic component and a connecting structure. The connecting structure includes a flexible member, a rigid shell, and a connecting edge. The flexible member is connected to the rigid shell via the connecting edge, and the connecting edge is made of flexible material; the electronic component is arranged at the rigid shell.

BRIEF DESCRIPTION OF THE DRAWINGS

Implementations of the present disclosure will now be described, by way of embodiment, with reference to the attached figures. It should be understood, the drawings are shown for illustrative purpose only, for ordinary person skilled in the art, other drawings obtained from these drawings without paying creative labor by an ordinary person skilled in the art should be within scope of the present disclosure.

DETAILED DESCRIPTION

Figure 1:
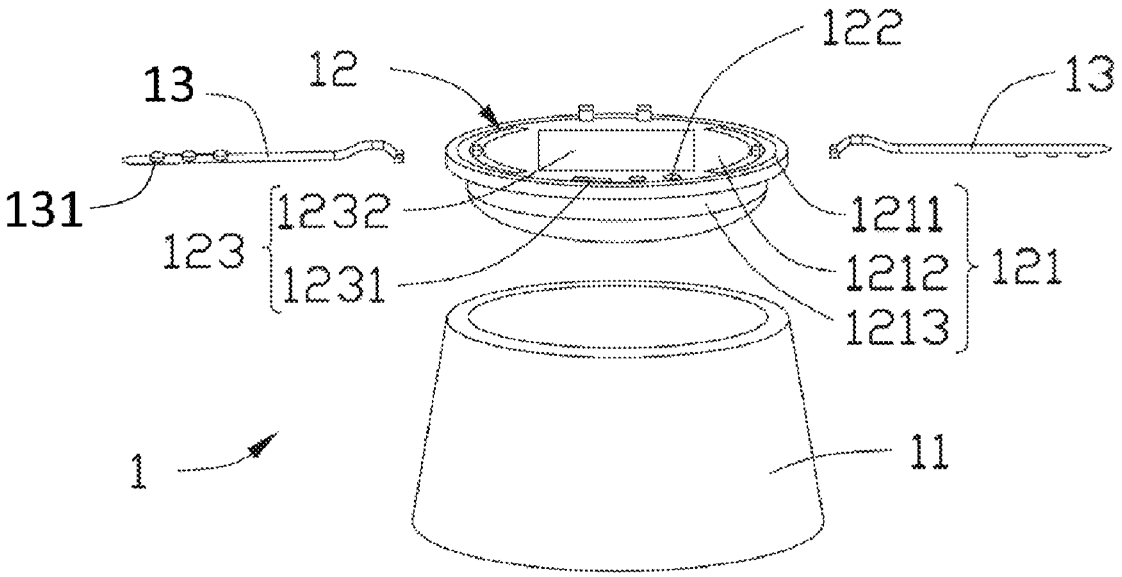
FIG. 1 is an exploded view of a multifunctional base according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". In addition, the terms "first" and "second" are used for descriptive purposes only and cannot be understood as indicating or implying relative importance or implying the number of indicated technical features. Thus, the features defined as "first" and "second" may explicitly or implicitly include one or more of the said features. In the description of embodiments of the application, "a plurality of" means two or more, unless otherwise specifically defined.

Figure 2:
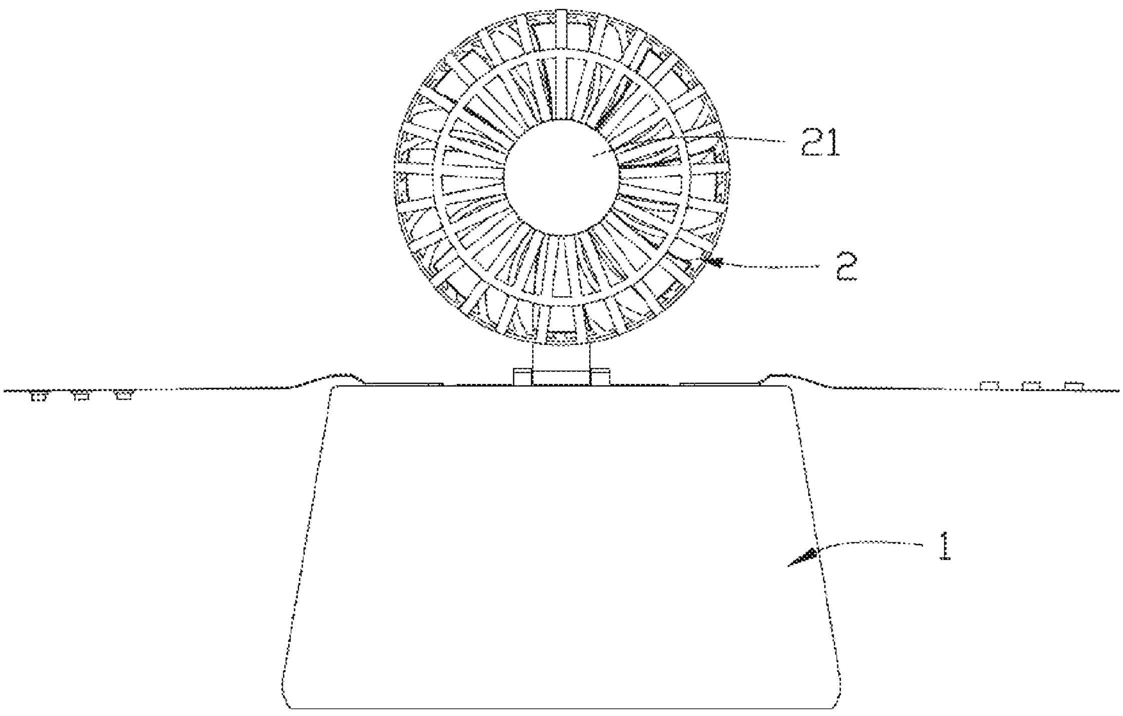
FIG. 2 is a front elevation view of an electronic device according to a first embodiment of the present disclosure.

Referring to FIGS. 1 and 2, an embodiment of the present disclosure provides a multifunctional base 1. The multifunctional base 1 includes a flexible member 11 and a base 12. The base 12 is arranged at a top of the flexible member 11. The base 12 includes a rigid shell 121 at least partially arranged in the top of the flexible member 11. The base 12 is generally made of rigid material, such as Acrylonitrile Butadiene Styrene (ABS) plastic, Polyethylene (PE), Polypropylene (PP), and ect., while the flexible member 11 is made of soft waterproof material, such as polyvinyl chloride (PVC), Thermoplastic polyurethanes (TPU), Polystyrene (PS), and etc. In order to better realize a connection between the flexible member 11 and the base 12, there is a connecting edge 1211 extending along a periphery of the rigid shell 121, and the flexible member 11 and the rigid shell 121 are sealed and connected via the connecting edge 1211. The connecting edge 1211 is made of flexible material, such as soft thermoplastics, including but not limited to polyvinyl chloride (PVC) and thermoplastic polyurethane elastoplastic rubber (TPU). The soft thermoplastics are fusible when heated and solidified after cooling. Therefore, the flexible member 11 can be tightly bonded with the connecting edge 1211 by hot pressing, hot melting or ultrasonic.

In at least one embodiment, the flexible member 11 can be an inflatable airbag. The connecting edge 1211 is connected to the inflatable airbag by hot-pressing. An air nozzle is arranged on the inflatable airbag and the inflatable airbag can be inflated or deflated through the air nozzle. The air nozzle can be arranged on the end of the inflatable airbag away from the base 12, in other words, the air nozzle can be arranged on a bottom of the inflatable airbag.

In at least one embodiment, the flexible member 11 is made of flexible plastic. The connecting edge 1211 is connected to the flexible member 11 by sewing or hot-pressing.

In at least one embodiment, the flexible member 11 is made of textile material, such as cloth. The connecting edge 1211 is connected to the flexible member 11 by sewing, hook and loop fasteners, clips, or buttons. In at least one embodiment, the flexible member 11 can be any currently available bag, such as a canvas bag or a school bag, the bag can be connected to the connecting edge 1211 by sewing, hook and loop fasteners, clips, or buttons so as to connect the base 12 and the flexible member (bag) 11 together. In this way, any available bags can be used to cooperate with the base 12 to function as the multifunctional base 1 without making any undesired change to the bag, which greatly increase applicability of the multifunctional base.

Additionally, cross-sectional area of the end of the flexible member 11 away from the base 12 is greater than that of the end of the flexible member 11 where the base 12 is arranged. That is, the flexible member 11 is in a substantial conical structure, with a cross-sectional area gradually decreased from the end away from the base 12 to the end where the base 12 is arranged. It should be noted that, a base of the conical structure is not limited to a round shape, but can be rectangular, triangular, or polygonal. More specifically, in actual use, the end of the flexible member 11 away from the base 12 is used as the bottom of the flexible member 11 to be placed on a supporting surface, such as a desk, or the ground. At this time, the base 12 is arranged at the top of the flexible member 11. Since the base 12 has weight, the cross-sectional area at the bottom of the flexible member 11 is larger than the cross-sectional area at the top of the flexible member 11, which helps to improve stability of the multifunctional base 1 and avoid gravity center instability of the multifunctional base 1 due to the weight of the base 12.

Furthermore, in order to improve stability of the flexible member 11, a supporting board can be arranged inside the bottom of the flexible member 11. The supporting board can provide further weight at the bottom of the flexible member 11 to further improve stability of the flexible member 11.

Specifically, the rigid shell 121 includes a first rigid shell 1212 and a second rigid shell 1213, the first rigid shell 1212 is arranged at a top of the second rigid shell 1213 to form a holding space inside the rigid shell 121. That is, a cavity is formed inside the rigid shell 121. The first rigid shell 1212 and the second rigid shell 1213 can be connected by locking fasteners, such as locked by screws, or the first rigid shell 1212 and the second rigid shell 1213 can be connected by snap fasteners. In this embodiment, the connecting edge 1211 is arranged around the top of the second rigid shell 1213. Specifically, the connecting edge 1211 is an annular thin-layer structure arranged on an outer circumference of the second rigid shell 1213. The connecting edge 1211 is integrally injection molded with the second rigid shell 1213. In an alternative embodiment, the rigid shell 121 includes a connecting ring, which is embedded on the connecting edge 1211 formed around the top of the second rigid shell 1213. The connecting ring is integrally formed with the second rigid shell 1213 by an injection molding process. A part of the connecting ring extending out from a periphery of the second rigid shell 1213 forms the connecting edge 1211. In addition, the connecting edge 1211 can also be arranged on the first rigid shell 1212 where the second rigid shell 1213 is connected in a same way, in which the connecting edge 1211 is arranged on the second rigid shell 1213. It can be sleeved around the first housing 1212 through the connecting ring. The connecting ring can be arranged around the first rigid shell 1212 and the connecting ring forms a connecting edge 1211 around the rigid shell 121 when the first rigid shell 1212 and the second rigid shell 1213 is connected.

Figure 8:
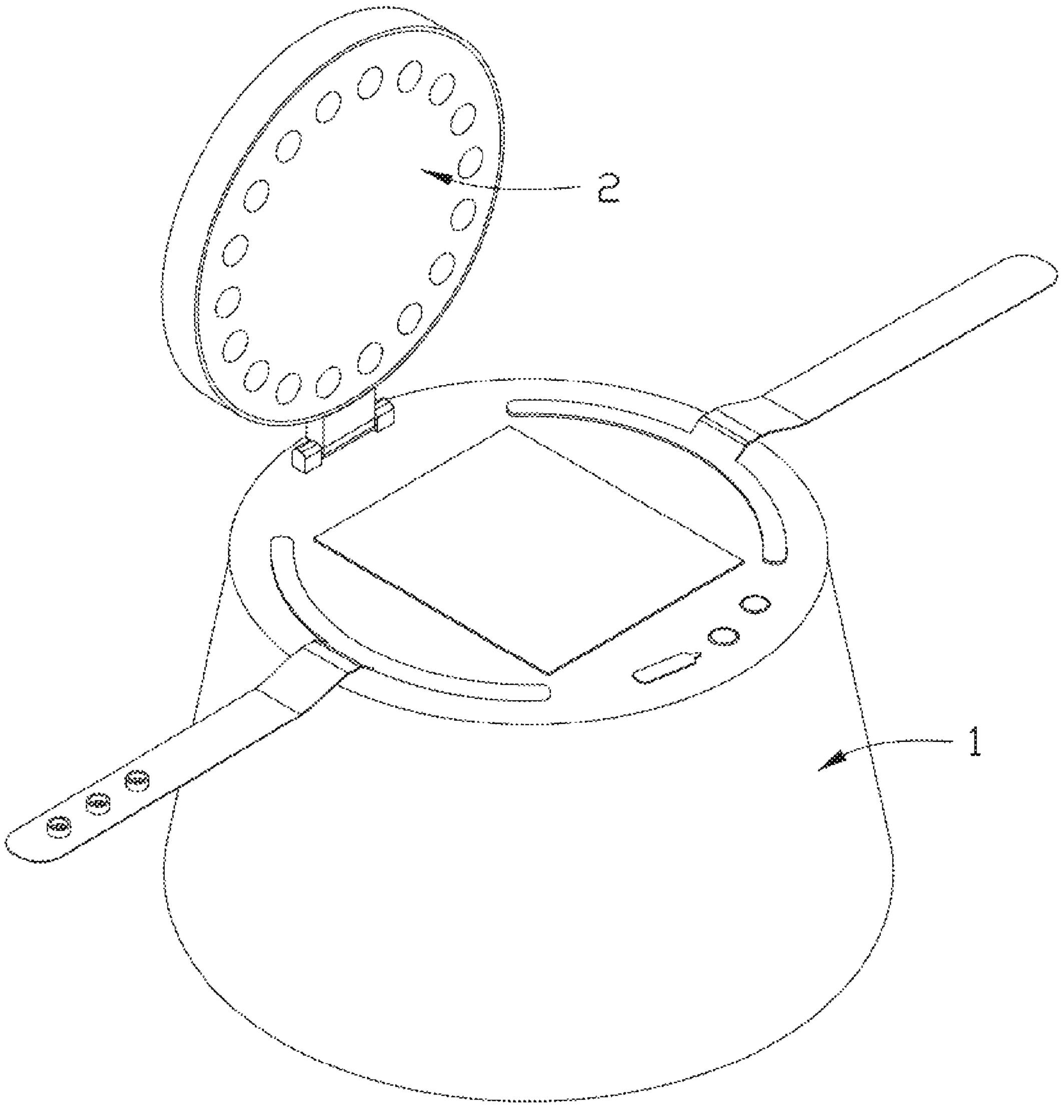
FIG. 8 is a schematic view of an electronic device according to a fifth embodiment of the present disclosure.
Figure 9:
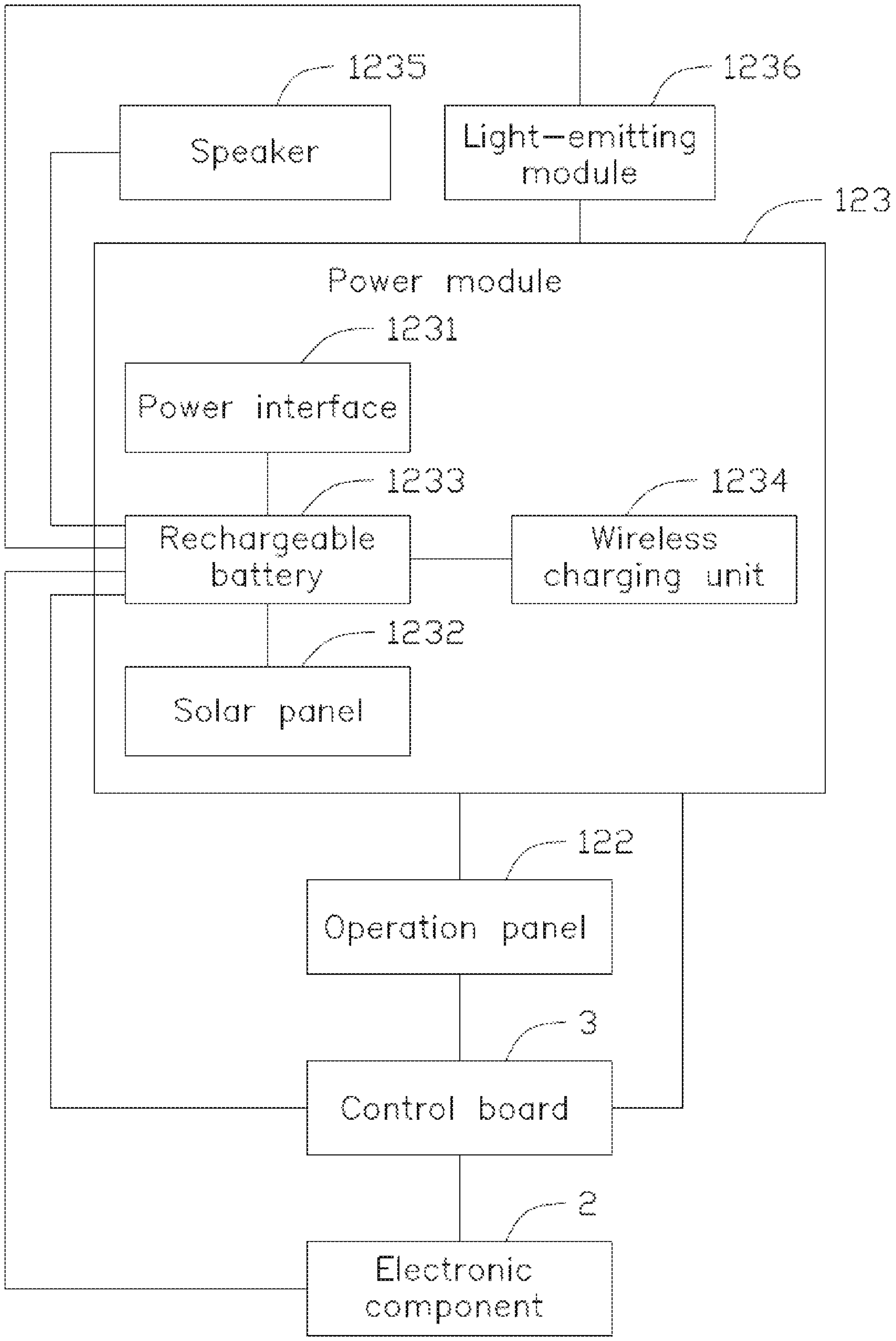
FIG. 9 is a structural block view of the electronic device of the present disclosure of FIG. 2.
Figure 10:
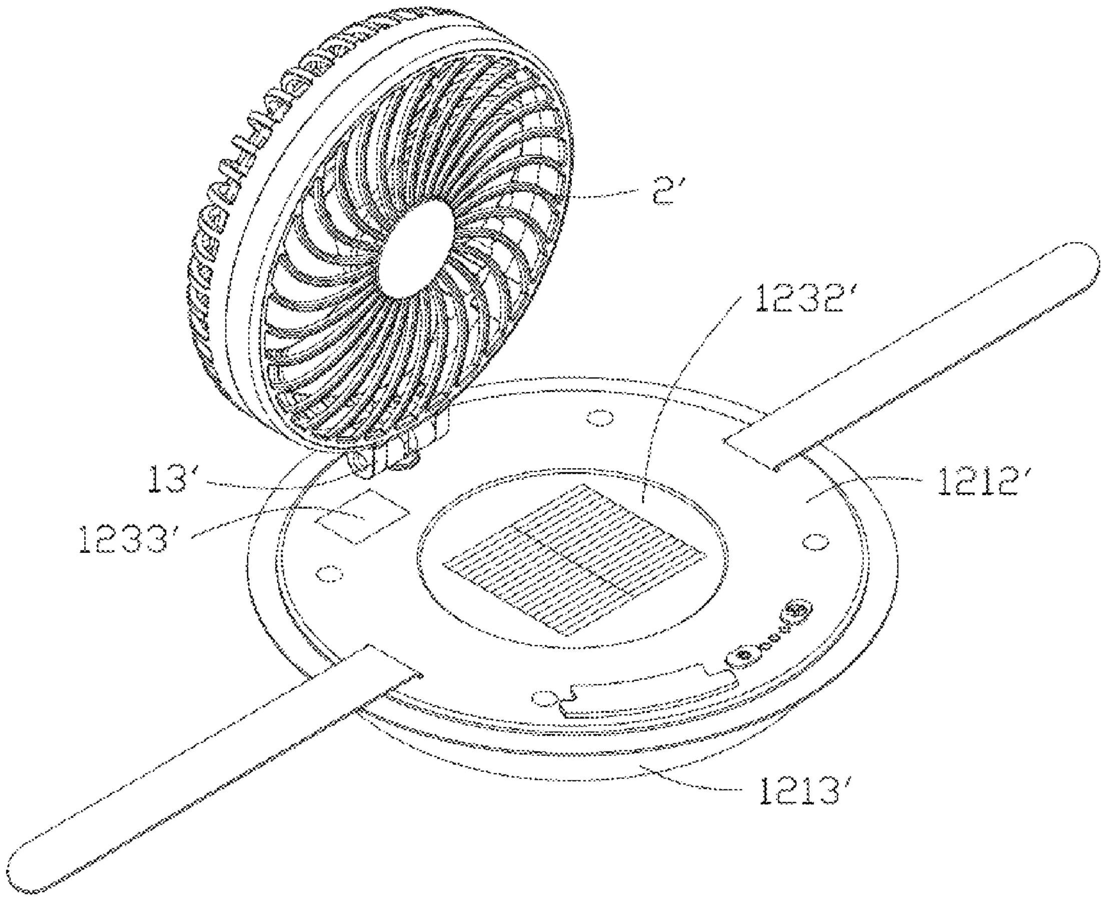
FIG. 10 is a schematic view of an electronic device according to a sixth embodiment of the present disclosure, wherein the flexible member is not shown here.
Figure 11:
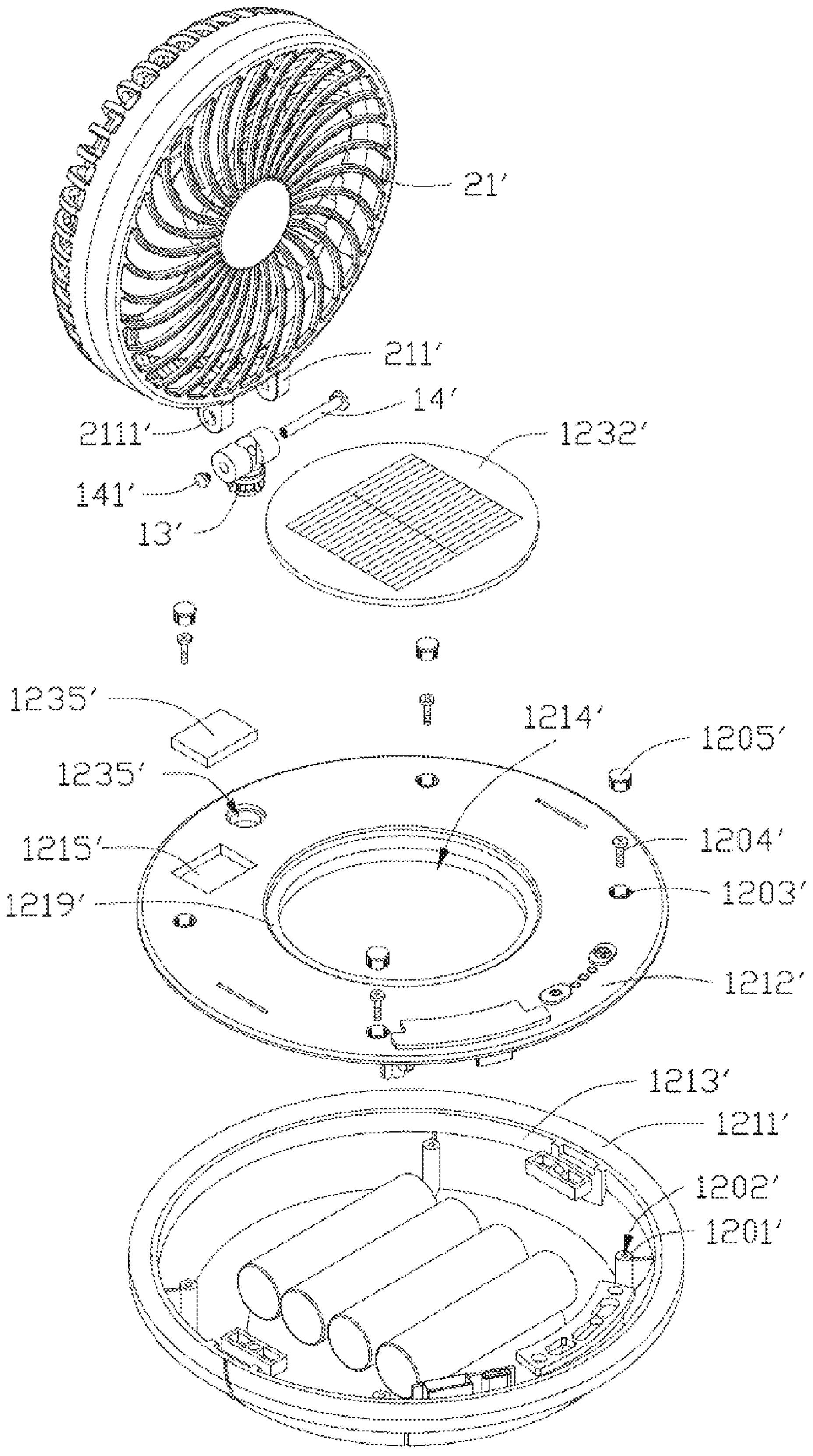
FIG. 11 is an exploded view of the electronic device of FIG. 10.
Figure 12:
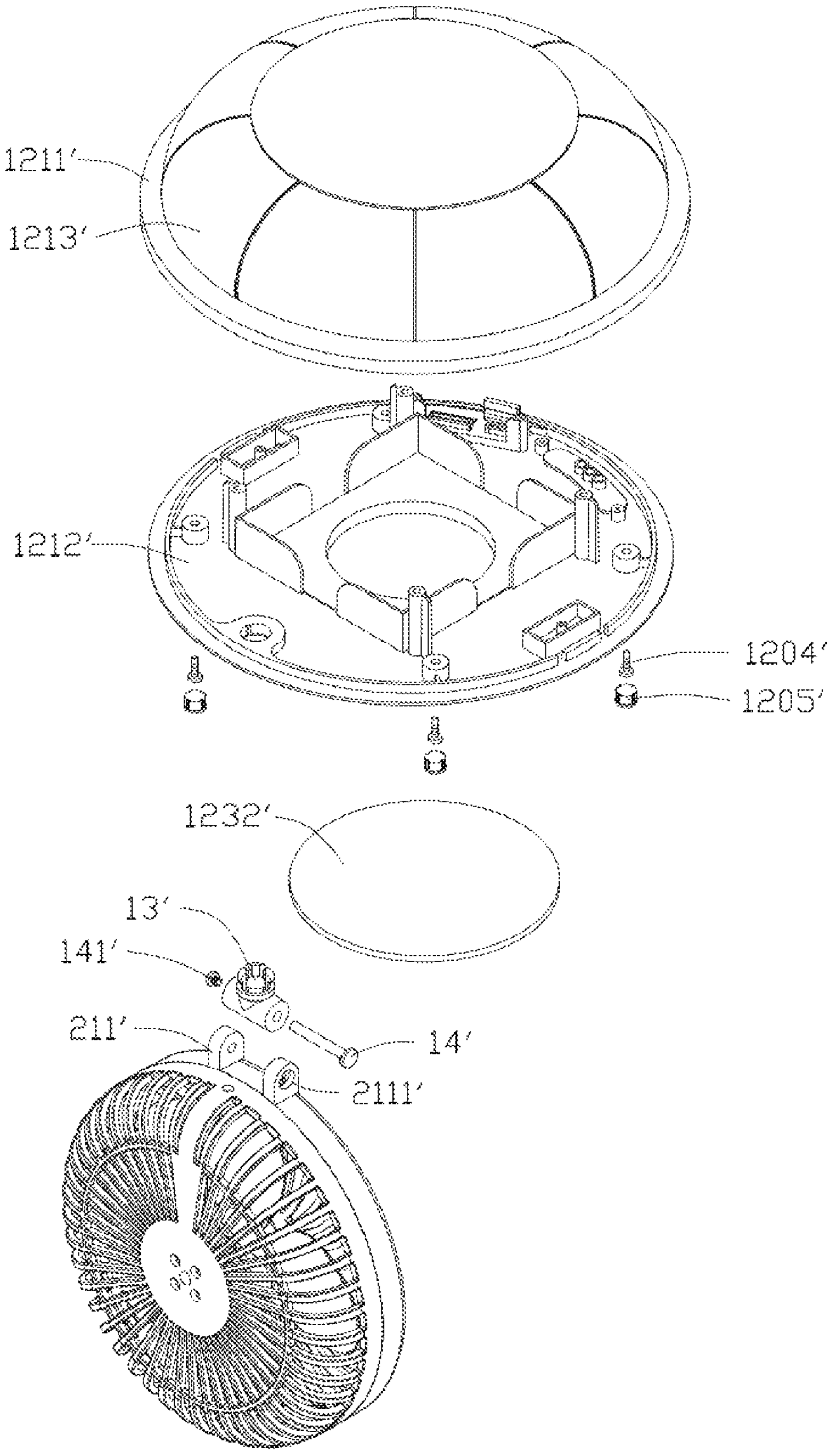
FIG. 12 is similar to FIG. 11, but shown in another view.
Figure 13:
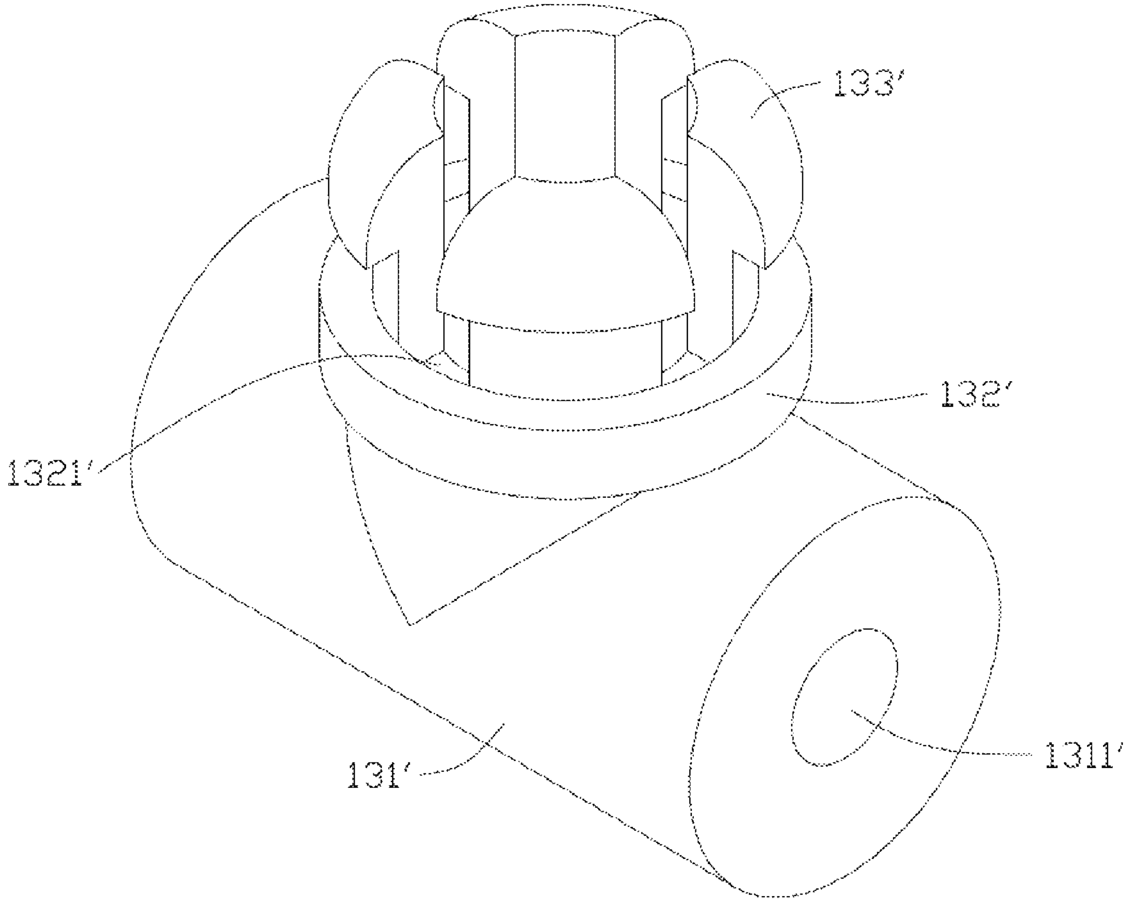
FIG. 13 is a schematic view of a connecting element of the electronic device of FIG. 10.
Figure 14:
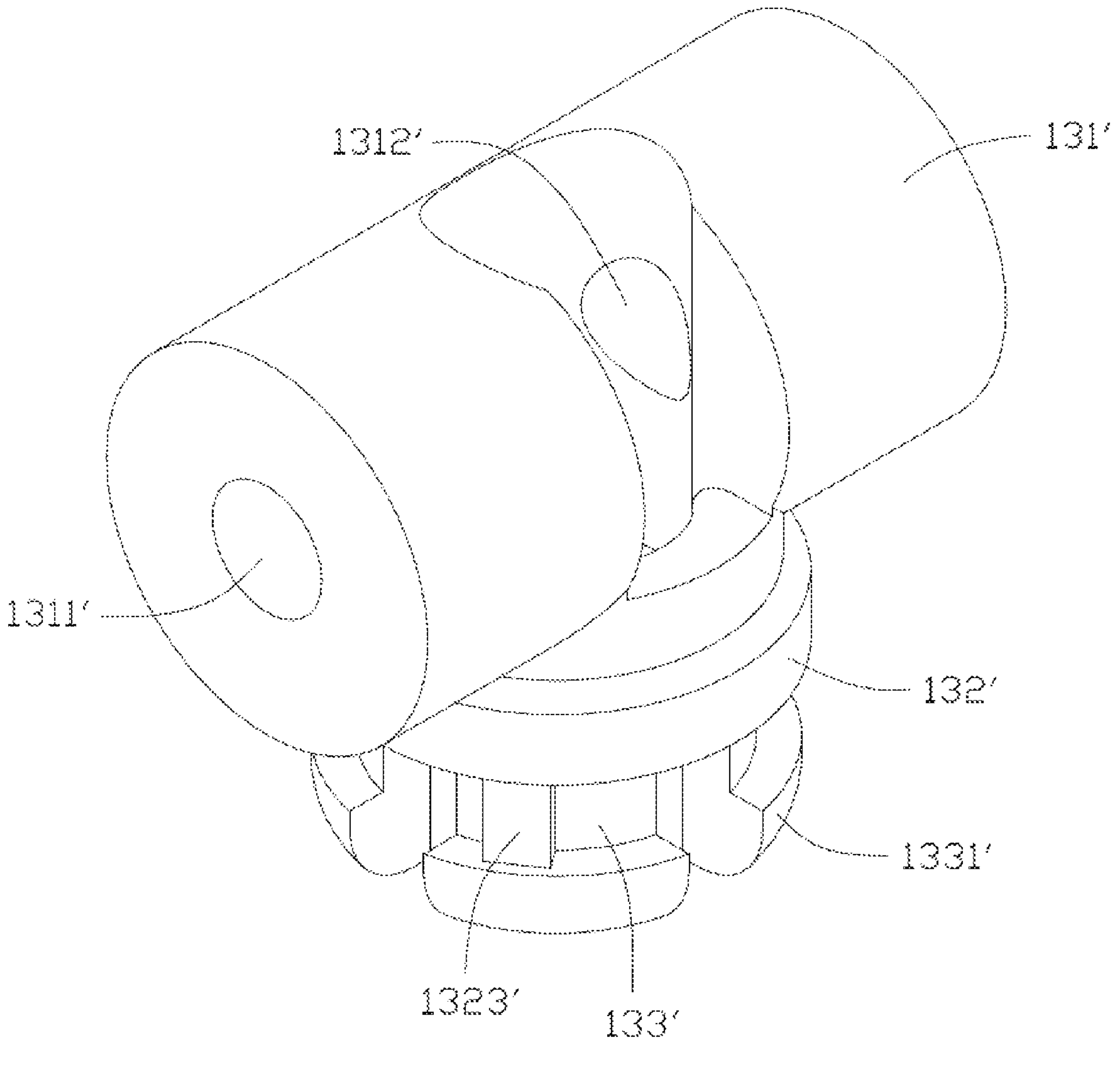
FIG. 14 is similar to FIG. 13, but shown in another view.
Figure 15:
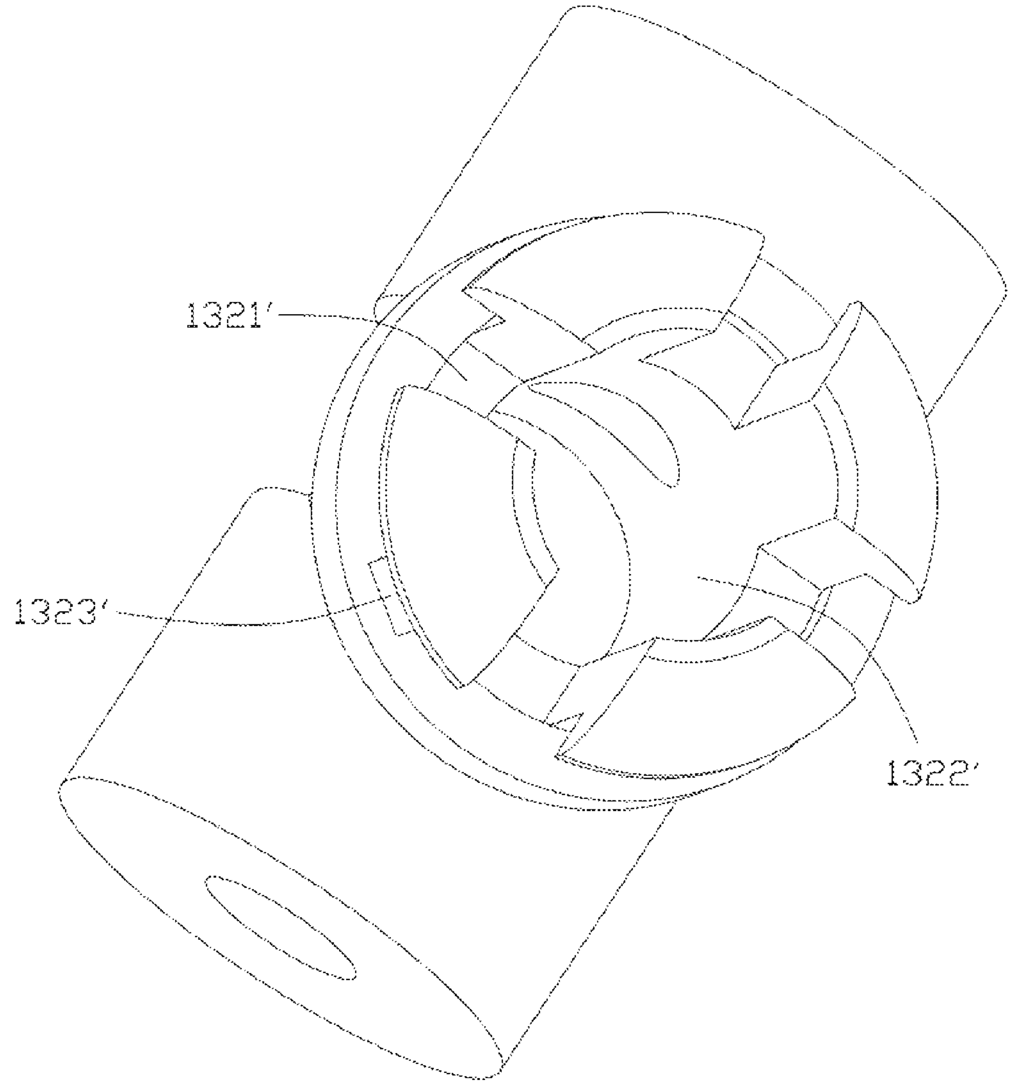
FIG. 15 is similar to FIG. 13, but shown in another view.
Figure 16:
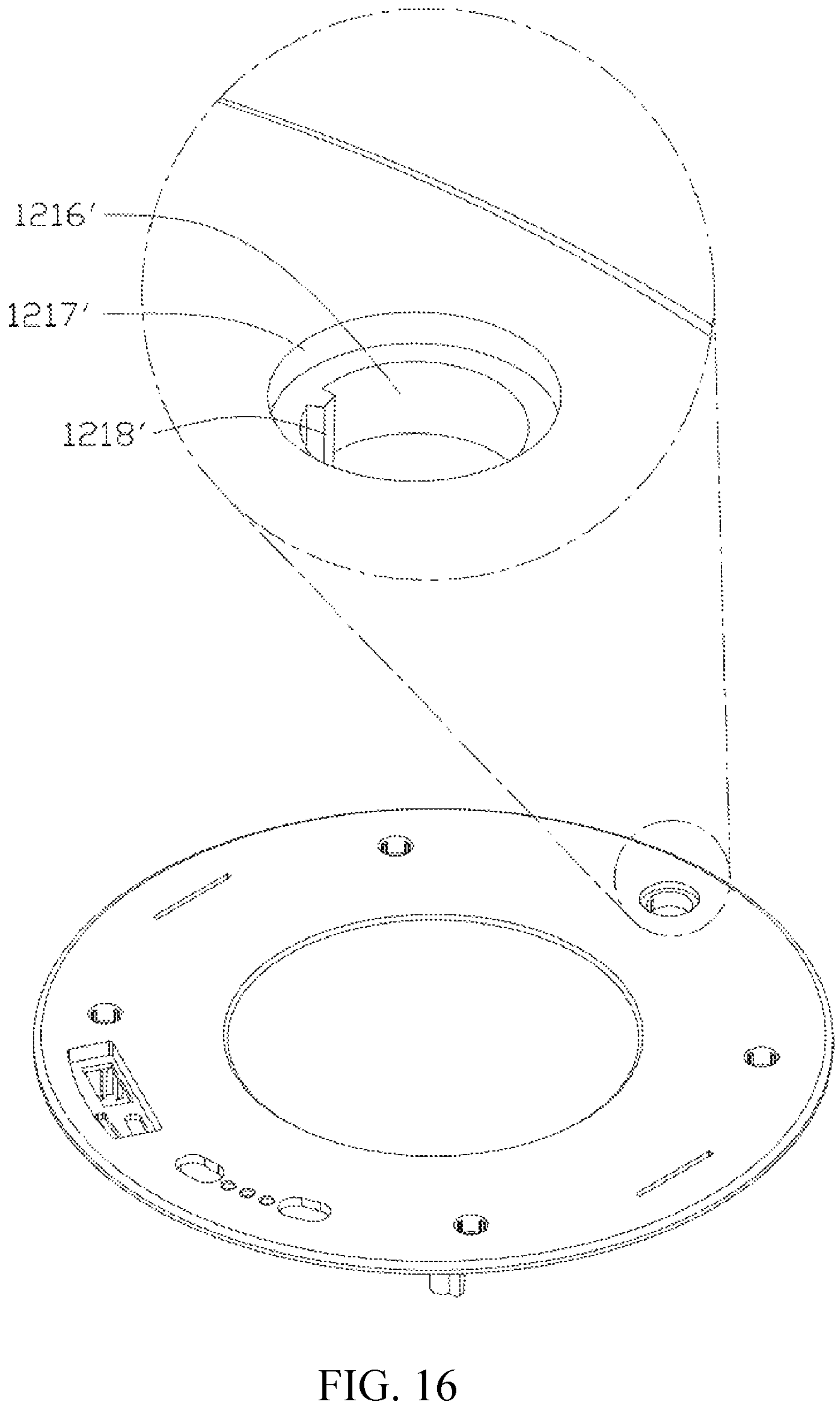
FIG. 16 are a schematic view of a first rigid shell of the electronic device of FIG. 10, and an enlarged view of a third through hole of the first rigid shell.

Additionally, referring to FIG. 8, the base 12 further includes an operation panel 122 and a power module 123. The power module 123 is arranged in the cavity inside the rigid shell 121. The operation panel 122 is exposed on an outer surface of the first rigid shell 1212. The power module 123 is electrically connected with the operation panel 122. The operation panel 122 can be an operation button or a touch operation panel. The power module 123 includes a rechargeable battery 1233 and a power interface 1231, which exposes the outer surface of the first rigid shell 1212. The rechargeable battery 1233 can be replaced with a new rechargeable battery. The rechargeable battery 1233 is electrically connected with the power interface 1231, through which external terminals or rechargeable batteries can be charged. The power interface 1231 can adopt a micro-USB interface, a USB type C interface or a lightning interface commonly available in the market.

Additionally, the power module 123 further includes a solar panel 1232 mounted on the top surface of the first rigid shell 1212. The solar panel 1232 is electrically connected to a rechargeable battery 1233 to charge the rechargeable battery 1233. The solar panel 1232 is water proof.

In at least one embodiment, the electronic device has a build-in Battery, so there is no need to arrange the solar panel 1232 on the top surface of the first rigid shell 1212.

In an alternative embodiment, the power module 123 may include a wireless charging unit 1234, which is arranged on the top surface of the first rigid shell 1212 and can charge external terminals. The wireless charging unit 1234 is electrically connected with the rechargeable battery 1233, and the rechargeable battery 1233 can be connected to an external power supply to be charged via the power interface 1231. The wireless charging unit 1234 includes a wireless charging coil and a magnet ring. The wireless charging coil is arranged on an inner side of the upper surface of the first rigid shell 1212, and the magnet ring is sleeved around the wireless charging coil and configured to absorb the external terminal attached with a magnet.

Figure 7:
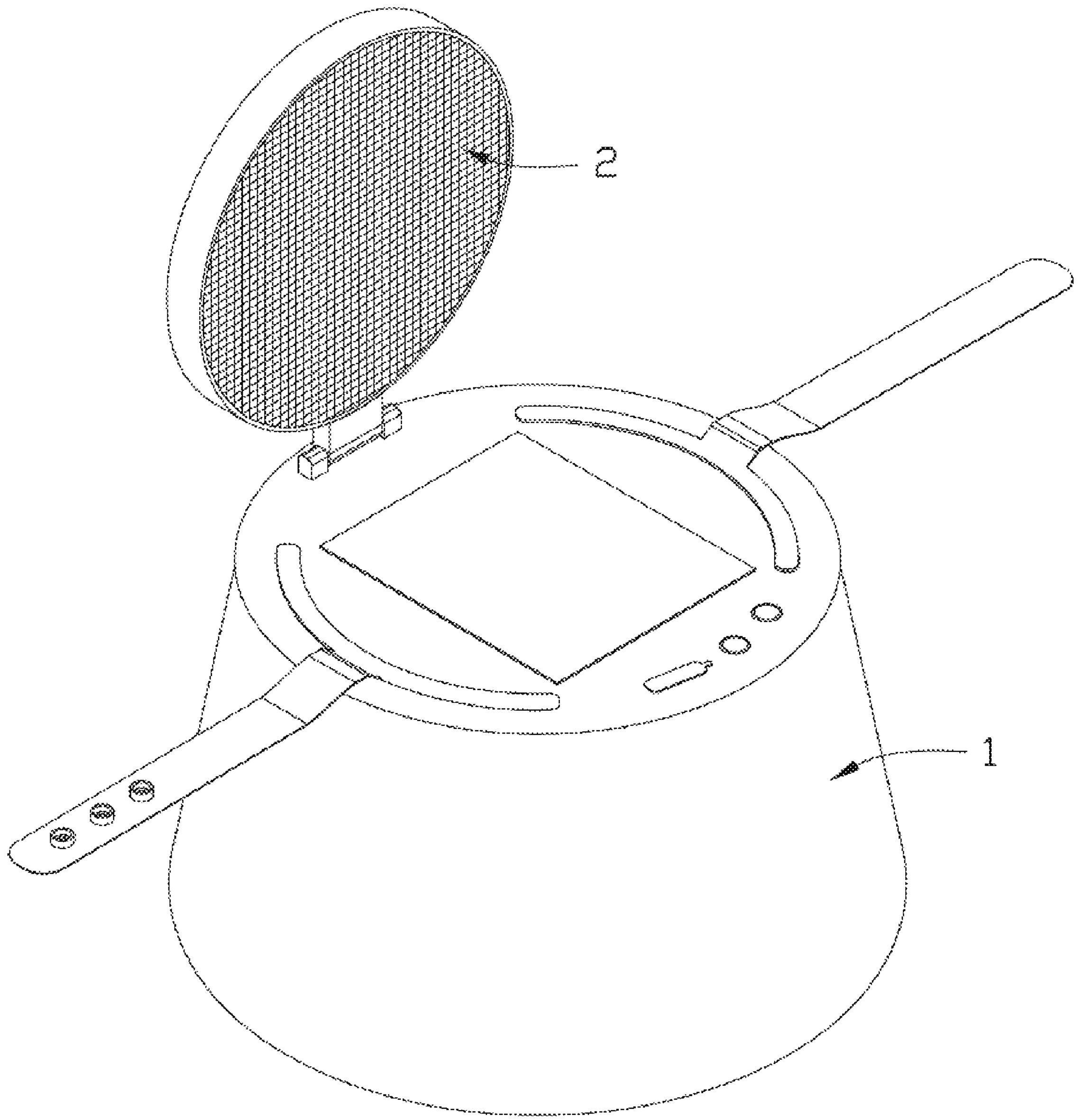
FIG. 7 is a schematic view of an electronic device according to a fourth embodiment of the present disclosure.

In at least one embodiment, referring to FIG. 7, a light-emitting module 1236 can be arranged on the surface of the rigid shell 121 facing the flexible member 11. The light-emitting module 1236 can be a base LED array, on which LED lamps are evenly arranged. The rechargeable battery 1233 supplies power to the LED array under control of a control board 3. A through hole is arranged at the bottom of the second rigid shell 1213, or the bottom of the second rigid shell 1213 is at least partially transparent/translucent. Light-emitting units of the LED lamps can irradiate into the flexible member 11 through the through hole so that the flexible member 11 can provide light. When the flexible member 11 is a waterproof inflatable bag, a waterproof lamp bag can be formed for outdoor lighting. In addition, opposite reflective surfaces are arranged on opposite inner sidewalls of the flexible member 11 to improve light scattering of the LED lamp.

In another embodiment, a light-emitting module 1236 is arranged on a bottom surface of the first rigid shell 1212. A through hole is arranged on a bottom of the second rigid shell 1213, the light-emitting module 1236 can irradiate into the flexible member 11 through the through hole so that the flexible member 11 can provide light. Or the bottom of the second rigid shell 1213 is at least partially transparent/translucent, the light-emitting module 1236 can irradiate into the flexible member 11 through the second rigid shell 1213 so that the flexible member 11 can provide light.

In at least one embodiment, the multifunctional base 1 further includes a speaker 1235. The speaker 1235 is arranged on a top surface of the first rigid shell 1212 opposite to the second rigid shell 1213; or the speaker 1235 is arranged on the second rigid shell 1213. User may communicate with the speaker 1235 to control the power module 123, the light-emitting module 1236, and household electrical appliances.

In at least one embodiment, the multifunctional base 1 is provided with a strap 13, which is convenient for users to lift and carry. Specifically, two straps 13 are arranged opposite to each other in the circumferential direction of the upper surface of the first rigid shell 1212. The straps 13 can be matched and connected with each other, and a length of the straps 13 after the two straps being connected can be adjusted. Specifically, each strap 13 is provided with an adjusting buckle 131, and the two straps 13 are buckled to form a hand ring by the adjusting buckle 131. The number of the adjusting buckles 131 can be multiple, and a size of the hand ring can be adjusted by multiple adjusting buckles 131. In another case, the two hand straps 13 can be hook and loop fasteners like Velcro, and a length of the strap can be adjusted by a bonding position of the hook and loop fasteners.

Figure 3:
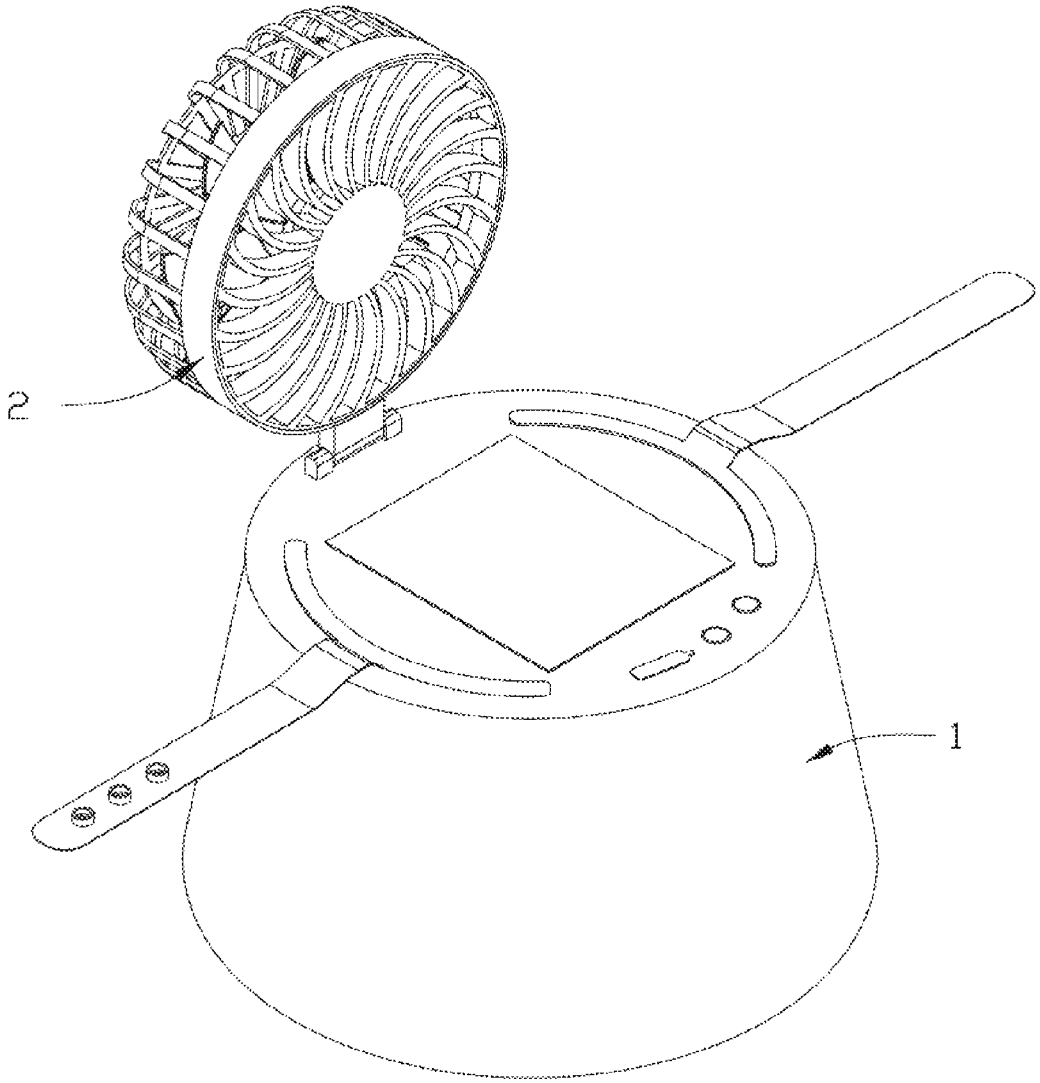
FIG. 3 is a schematic view of the electronic device of FIG. 2.
Figure 4:
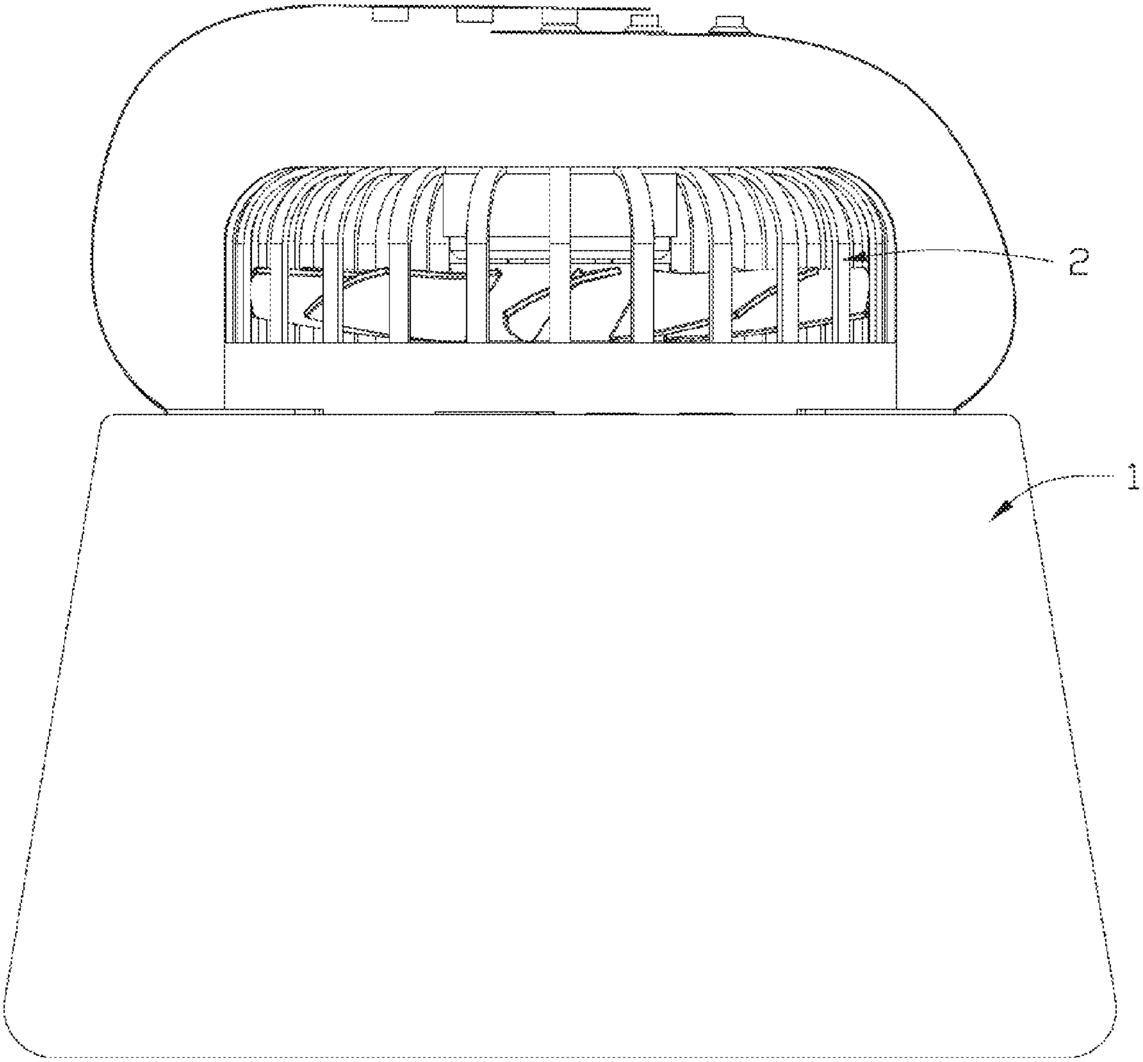
FIG. 4 is a schematic view of the electronic device in a folded state.

The present disclosure further provides an electronic device, referring to FIGS. 3 and 4, the portable electronic device includes the multifunctional base 1 discussed in the above-mentioned embodiments, and an electronic component 2. The electronic component 2 is arranged on an outer side of the rigid shell 121 of the multifunctional base 1 and electrically connected to the multifunctional base 1. One end of the multifunctional base 1 is the flexible member 11, the electronic component 2 is arranged at the other end of the multifunctional base 1. The electronic component 2 can be a fan 21, a mosquito-killing device, an LED mirror, or spray water refill instrument. For ease of description, in the following embodiment, the electronic component takes the fan 21 as an example.

The fan 21 is arranged on the outside of the first rigid shell 1212 of the multifunctional base 1, and is electrically connected with a control board 3 inside the rigid shell 121. The fan 21 is electrically connected to the control board 3 in a fixed way, for example, a through hole is defined at the first rigid shell 1212, and a wire passes through the through hole to connect the fan 21 with the control board 3. In other embodiment, the fan 21 can be electrically connected to the control board 3 in a detachable way. For example, the first rigid shell 1212 is provided with a first metal contact electrically connected to the control board 3, the fan 21 is provided with a second metal contact. The fan 21 is electrically connected to the control board 3 by connecting the first metal contact with the second metal contact. Through the connection between the first metal contact and the second metal contact, the power module 123 can supply power to the fan 21. Similarly, when the electronic component 2 is of other types, the above two different connection ways can also be employed.

In at least one embodiment, the operation panel 122 is provided with control buttons configured to adjust and control air volume output by the fan 21. When the electronic component 2 is of other types, the operation panel 122 can be configured to control corresponding functions, for example, switch on/off lamps on the electronic component 2, adjust brightness of the lamps on the electronic component 2, or switch on/off the electronic component 2.

Referring to FIG. 4, the fan 21 can be a foldable fan. Specifically, the fan 21 can be pivotably connected to the functional base 1 by a hinge. The hinge may include a pivotable shaft, around which the fan 21 rotate relative to the functional base 1. Additionally, an elastic spring is used at the hinge to keep the fan 21 in an unfolded or a folded position. The fan 21 can rotate around the pivotable shaft to the folded position where the fan 21 is attached onto an outer surface of the first rigid shell 1212, which is convenient for storage. It should be understood, when the electronic component is of other types, the electronic component can be folded in the same way.

Figure 5:
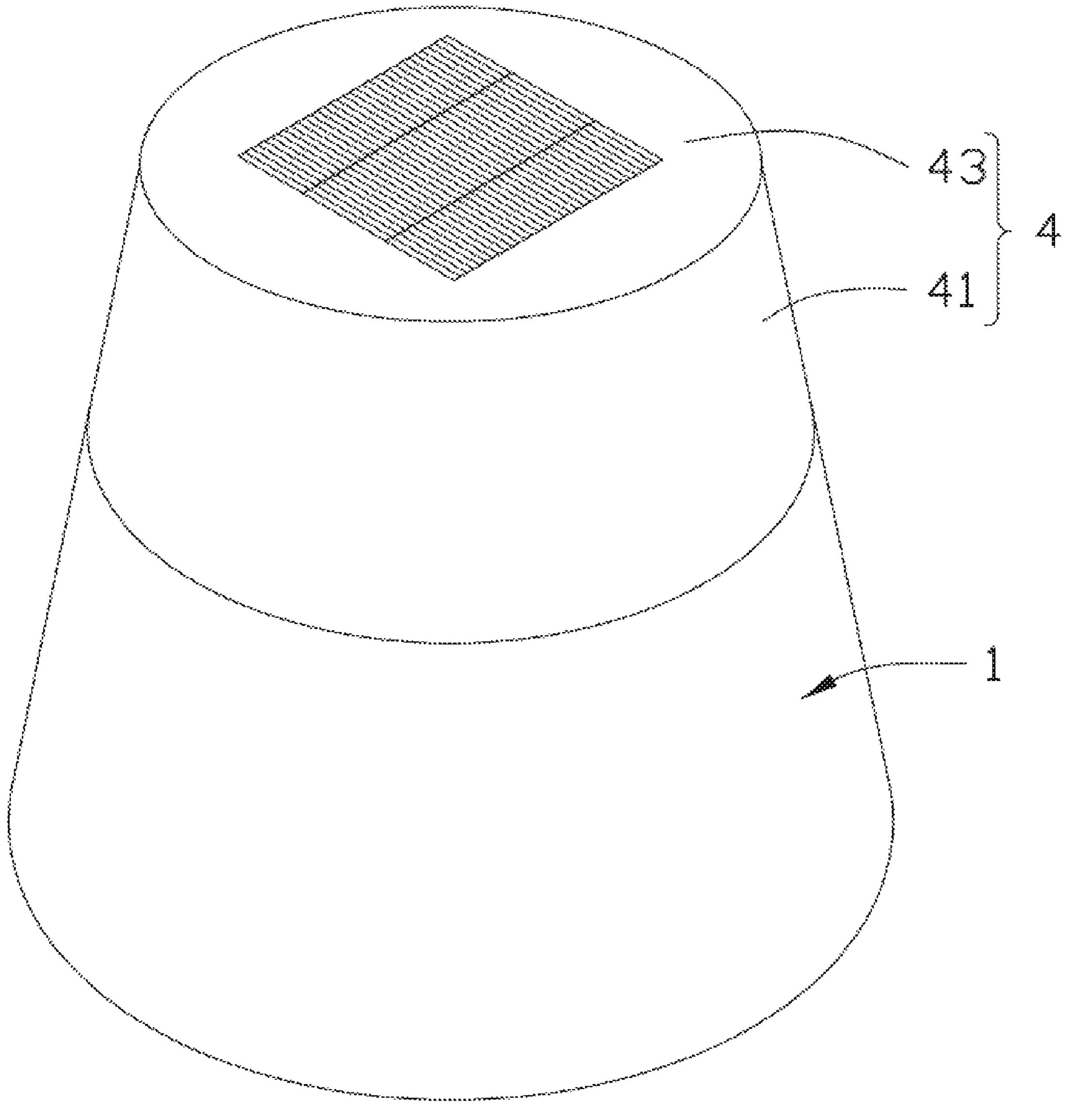
FIG. 5 is a schematic view of an electronic device according to a second embodiment of the present disclosure.
Figure 6:
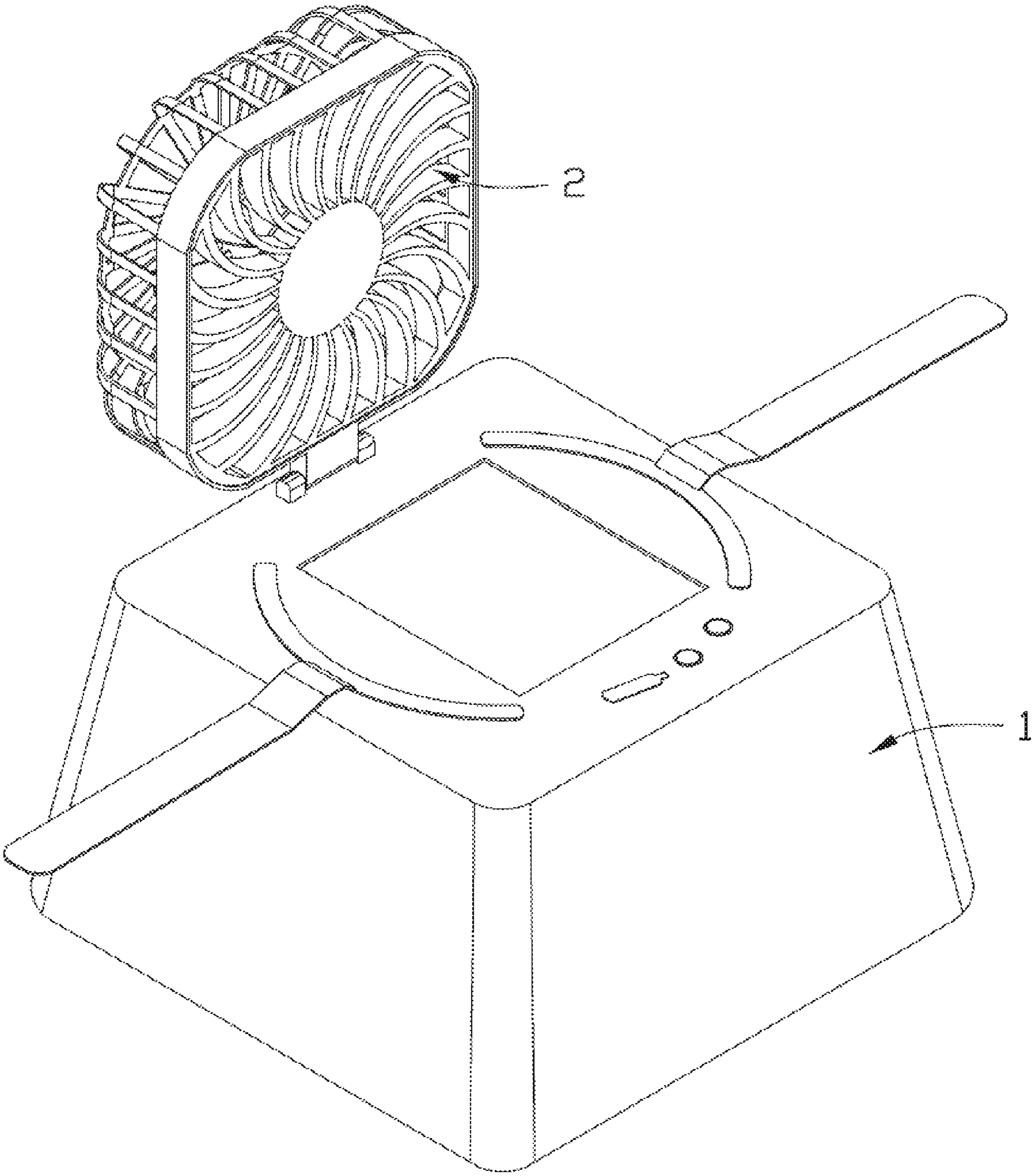
FIG. 6 is a schematic view of an electronic device according to a third embodiment of the present disclosure.

Referring to FIGS. 5 and 7, the electronic component 2 can be of different types, such as a mosquito-killing lamp, a humidifier, a camping light, or a LED mirror. Theses electronic components 2 can be folded in the same way to be attached onto the outer surface of the first rigid shell 1212. Referring to FIG. 6, the multifunctional base 1 has a square shape, a trapezoid shape, and the electronic component 2 also has a square shape, a trapezoid shape.

In at least one embodiment, referring to FIG. 5, the present disclosure further provides an electronic device according to a second embodiment, which further includes a cover 4 detachably connected to the base 1 to cover the electronic component 2. When the electronic component 2 is folded onto the upper surface of the base 1, the cover 4 can cover the electronic component 2 to protect the electronic component 2. In at least one embodiment, the cover 4 includes a body 41 and another solar panel 43 arranged at a top of the body 41 and configured to recharge the rechargeable battery 1233 of the electronic component 2. Therefore, when the cover 4 covers the electronic component 2, the solar panel 43 can collect sunlight to recharge the rechargeable battery 1233 of the electronic component 2.

In actual use, when the flexible member 11 is the inflatable airbag, the inflatable airbag inflated, the electronic component 2 is rotated to an unfolded position, functions of the electronic component 2 can be controlled by the operation panel 122. The electronic component 2 is powered on by the power module 123 inside the rigid shell 121. When the portable electronic device is placed on a supporting surface, the multifunctional base 1 is supported by the inflatable airbag; or the LED lamps are switched on, the two straps 13 are connected to form a hand ring, which allows the portable electronic device to be hung onto a supporting device like a pole to function as a waterproof lamp bag. After use, the electronic component 2 will be folded towards the first rigid shell 1212, and the inflatable airbag will be deflated and compressed, which can greatly reduce a volume of portable electronic device, thus being convenient for storage and carry.

The present disclosure has beneficial effects that: the multifunctional base 1 of the present disclosure is provided with the flexible member 11, and the flexible member 11 can be compressed, which is convenient for the user to store the multifunctional base 1, facilitate the users travel, greatly improve the convenience and have strong practicability; The setting of the connecting edge 1211 facilitates the connection between the flexible member 11 and the rigid shell 121; The multifunctional base 1 is equipped with a solar panel 1232, which can charge the rechargeable battery 1233, or the multifunctional base 1 is equipped with a wireless charging unit 1234, which can charge the external terminal. The electronic component 2 is detachably electrically connected to the multifunctional base 1, which fully considers replaceability of the electronic component 2. It can not only allow users to replace the electronic component 2 with electronic components having various functions to improve applicability of the multifunctional base 1, but also allow users to replace a damaged electronic component with a new electronic component, so as to prolong service life of the portable electronic device. The electronic component 2 can be folded, which is convenient for storage. When making the multifunctional base, the flexible member 11 can be connected with the second rigid shell, the control board 3 and other electronic elements can be arranged on the first rigid shell, which is convenient for assembly, thus improving assembly efficiency. Electronic components 2 with different functions or structures can commonly adapted to the flexible member 11 and the first rigid shell 121, which can save molding cost and is convenient for maintenance, replacement or upgrading of the electronic device.

An embodiment of the present disclosure provides a connecting structure. The connecting structure can be in a similar structure with the multifunctional base 1 and include the flexible member 11, the rigid shell 121 and the connecting edge 1211. The flexible member 11 is connected to the rigid shell 121 via the connecting edge 1211. The connecting edge 1211 is made of flexible material. The flexible member 11, the rigid shell 121, the connecting edge 1211, and the way in which the flexible member 11 and the rigid shell 121 are connected by the connecting edge 1211 illustrated in the above-mentioned embodiments are also applicable to this embodiment and will not be repeated here.

The connecting structure provided by the embodiment of the present disclosure can connect the flexible member 11 with the rigid shell 121. The flexible member 11 can be any structure made of flexible material. The rigid shell 121 can be a base or a housing of an electronic device or component. Therefore, the connecting structure can connect electronic devices or electronic components 2 with any available flexible member 11, such as bags, flexible members 11 arranged on sofa, deckchairs. For example, cloth or leather of a sofa can function as the flexible member 11, which can be connected with a base for supporting an electronic device or a housing of an electronic device. A backpack can be used as the flexible member 11 and can be connected with a base for supporting an electronic device or a housing of an electronic device, thereby achieving a connection between the back pack with the electronic device.

An embodiment of the present disclosure provides an electronic device, which includes the connecting structure and an electronic component 2, the electronic component 2 is arranged at the rigid shell 121.

In at least one embodiment, the electronic component 2 can be a fan, a mosquito-killing lamp, an LED mirror, or a stereo.

In at least one embodiment, the electronic component 2 is detachably or pivotably connected to the rigid shell 121.

In at least one embodiment, the electronic component 2 can be folded onto the rigid shell 121, which is convenient for storage or carry. In at least one embodiment, the portable electronic device further includes a cover 4, the cover 4 is detachably connected to the rigid shell 121 to cover the electronic component 2. When the electronic component 2 is folded onto the rigid shell 121, the cover 4 can cover the electronic component 2 to protect the electronic component 2. In at least one embodiment, the cover 4 includes a body 41 and a solar panel 43 arranged at a top of the body 41 and configured to recharge a rechargeable battery 1233 of the electronic component 2. Therefore, when the cover 4 covers the electronic component 2, the solar panel 43 can collect sunlight to recharge the rechargeable battery 1233 of the electronic component 2.

Referring to FIGS. 10 to 16, the present disclosure provides an electronic device according to a sixth embodiment. The electronic device according to the sixth embodiment is similar to the electronic device according to the first embodiment. The differences between the electronic device according to the sixth embodiment and the electronic device according to the first embodiment include: (a) the first rigid shell 1212' defines a first through hole 1214' and a second through hole 1215', the first through hole 1214' is configured to receive the solar panel 1232', the second through hole 1215' is configured to receive the speaker 1235'; (b) the second rigid shell 1213' is protruded with at least one connecting column 1201' having a first connecting hole 1202', the first rigid shell 1212' includes at least one second connecting hole 1203', a connecting element 1204' is received in the first connecting hole 1202' and the second connecting hole 1203' to connect the first rigid shell 1212' and the second rigid shell 1213' together; (c) the electronic device according to the sixth embodiment further includes a rotating element 13', the electronic component 2', such as the fan 21', is connected with the rotating element 13', the first rigid shell 1212' further defines a third through hole 1216', the rotating element 13' is rotatably received in the third through hole 1216' for bringing the electronic component 2' to rotate about a radial axis of the rotating element 13'; (d) the electronic device according to the sixth embodiment further includes a connecting shaft 14', the electronic component 2' has at least one connecting end 211', the connecting shaft 14' is fixedly connected with the connecting end 211', and the connecting shaft 14' is rotatably connected with the rotating element 13', so that the electronic component 2' is capable of rotating about an axial axis of the rotating element 13.

In at least one embodiment, the second rigid shell 1213' also has a connecting edge 1211' extending along a periphery of the second rigid shell 1213', the connecting edge 1211' of the second rigid shell 1213' can be tightly bonded with the the flexible member by hot pressing, hot melting or ultrasonic.

In at least one embodiment, the solar panel 1232' is sealingly received in the first through hole 1214', and the speaker 1235' is sealingly received in the second through hole 1215'.

In at least one embodiment, the speaker 1235' is sealingly received in the second through hole 1215'.

In at least one embodiment, a side wall of the first through hole 1214' is protruded with a supporting element 1219', the solar panel 1232' is supported by the supporting element 1219'.

In at least one embodiment, a lower end of the side wall of the first through hole 1214' is protruded with the supporting element 1219'.

In at least one embodiment, the supporting element 1219' is extended along a circumference of the side wall of the first through hole 1214'.

In at least one embodiment, the second rigid shell 1213' has a plurality of connecting columns 1201' spaced apart with each other, each connecting columns 1201' has one first connecting hole 1202', the first rigid shell 1212' includes a plurality of second connecting holes 1203', the connecting elements 1204' are respectively received in the first connecting holes 1202' and the second connecting holes 1203' to connect the first rigid shell 1212' and the second rigid shell 1213' together.

In at least one embodiment, the second connecting holes 1203' are spaced apart from each other and arranged around the first through hole 1214'.

In at least one embodiment, the connecting column 1201' has a cylindrical shape, a square shape, and so on.

In at least one embodiment, the first rigid shell 1212' further includes at least one connecting head 1205' received in the second connecting hole 1203', one end of the connecting element 1204' is connected with the connecting head 1205', the other end of the connecting element 1204' is received in the first connecting hole 1202', to connect the first rigid shell 1212' and the second rigid shell 1213' together.

In at least one embodiment, the rotating element 13' includes a connecting part 131', a rotating part 132' connected with a side of the connecting part 131' away from the electronic component 2', and at least one clamping part 133' connected with an end of the rotating part 132' away from the connecting part 131'.

In at least one embodiment, the connecting part 131' defines a fourth through hole 1311' along an axial direction of the connecting part 131' and a fifth through hole 1312' along a radial direction of the connecting part 131'.

In at least one embodiment, the rotating element 13' further includes a receiving groove 1321', a bottom wall of the receiving groove 1321' defines a sixth through hole 1322' communicated with the fifth through hole 1312'. An end of an electrical wire (not shown) is electrically connected with the rechargeable battery 1233', the other end of the electrical wire is passed through the sixth through hole 1322' and the fifth through hole 1312', and electrically connected with the electrical component 2'.

In at least one embodiment, the clamping part 133' is arranged on the bottom wall of the receiving groove 1321'.

In at least one embodiment, there are a plurality of clamping parts 133' spaced apart from each other, the clamping parts 133' are arranged on the bottom wall of the receiving groove 1321' and around the fifth through hole 1312'.

In at least one embodiment, a free end of the clamping part 133' has a limiting part 1331' protruded away from a center of the sixth through hole 1322'.

In at least one embodiment, a top end of a side wall of the third through hole 1216' is concaved to form a seventh through hole 1217' communicated with the third through hole 1216'. The rotating part 132' is rotatably received in the seventh through hole 1217', the clamping part 133' is rotatably received in the third through hole 1216', and the clamping part 1331' is limited by a periphery of the side wall of the third through hole 1216' to prevent the rotating part 132' from escaping from the third through hole 1216'. When rotating part 132' rotates in the seventh through hole 1217', the electronic component 2' also rotate about the radial axis of the rotating element 13'.

In at least one embodiment, the side wall of the third through hole 1216' also has a first blocking rib 1218' arranged along a radial axis of the third through hole 1216', at least one of the rotating part 132' has a second blocking rib 1323' arranged along a radial axis of the rotating part 132'. When the rotating part 132' rotates in the seventh through hole 1217', the clamping part 133' rotates in the third through hole 1216', the first blocking rib 1218' may be blocked by the second blocking rib 1323' to limit a rotating range of the rotating part 132', further to limit a rotating range of the electronic component 2'.

In at least one embodiment, the electronic component 2' has two opposite connecting ends 211', each connecting ends 211' has a via hole 2111', the connecting shaft 14' is fixedly received in the via hole 2111', the connecting shaft 14' is also rotatably received in the fourth through hole 1311', so that the electronic component 2' is capable of rotating about an axial axis of the connecting part 131'.

In at least one embodiment, at least one fastener 141' is arranged in the fourth through hole 1311' and connected with an end of the connecting shaft 14' to prevent the connecting shaft 14' from escaping from the fourth through hole 1311' and the via hole 2111'.

The above description only describes embodiments of the present disclosure, and is not intended to limit the present disclosure, various modifications and changes can be made to the present disclosure. Any modifications, equivalent substitutions, improvements, etc. made within the spirit and scope of the present disclosure are intended to be included within the scope of the present disclosure.

What is claimed is:

1. A multifunctional base, comprising:

a flexible member; and a base, connected to an end of the flexible member, wherein the base comprises a rigid shell and a connecting edge, the connecting edge extends along a periphery of the rigid shell, the flexible member is connected to the base via the connecting edge, and the connecting edge is made of flexible material;

wherein the base further comprises a power module, the rigid shell further comprises a first rigid shell and a second rigid shell connected to the first rigid shell to define a cavity, the power module is arranged inside the cavity; and wherein the connecting edge is arranged around a periphery of a top of the second rigid shell, the connecting edge and the second rigid shell are integrally formed, the connecting edge is made of soft thermoplastics.

2. A multifunctional base, comprising:

a flexible member; and a base, connected to an end of the flexible member, wherein the base comprises a rigid shell and a connecting edge, the connecting edge extends along a periphery of the rigid shell, the flexible member is connected to the base via the connecting edge, and the connecting edge is made of flexible material;

wherein the base further comprises a power module, the rigid shell further comprises a first rigid shell and a second rigid shell connected to the first rigid shell to define a cavity, the power module is arranged inside the cavity; and the base further comprises an operation panel exposed to an outer surface of the first rigid shell, the flexible member defines a holding space, the second rigid shell is at least partially arranged in the holding space, the power module is electrically connected to the operation panel.

3. The multifunctional base according to claim 1, wherein the power module comprises a solar panel, the solar panel is arranged at a top of the first rigid shell and connected to a rechargeable battery; or the first rigid shell defines a first through hole, the solar panel is received in the first through hole.

4. The multifunctional base according to claim 1, further comprising a light-emitting module, the light-emitting module is arranged on the second rigid shell, and a bottom of the second rigid shell is at least partially transparent; or the light-emitting module is arranged on a bottom surface of the second rigid shell facing the flexible member; or the light-emitting module is arranged on a bottom surface of the first rigid shell facing the second rigid shell, and a bottom of the second rigid shell is at least partially transparent.

5. The multifunctional base according to claim 1, further comprising a speaker, the speaker is arranged on a top surface of the first rigid shell opposite to the second rigid shell; or the first rigid shell defines a second through hole for receiving the speaker; or the speaker is arranged on the second rigid shell.

6. The multifunctional base according to claim 1, wherein further comprising at least one connecting element, the second rigid shell includes at least one connecting column, the first rigid shell comprises at least one connecting hole, one end of the connecting element is received in the connecting hole, another end of the connecting element is connected with the connecting column to connect the first rigid shell and the second rigid shell together.

7. The multifunctional base according to claim 1, wherein the flexible member is an inflatable airbag, and the inflatable airbag is connected and sealed with the connecting edge by hot-pressing.

* * * * *